US009091371B2

(12) United States Patent
Lee

(10) Patent No.: US 9,091,371 B2
(45) Date of Patent: Jul. 28, 2015

(54) SINGLE AXIS GATE VALVE FOR VACUUM APPLICATIONS

(76) Inventor: Kenneth K L Lee, San Jose, CA (US)

(*) Notice: Subject to any disclaimer, the term of this patent is extended or adjusted under 35 U.S.C. 154(b) by 923 days.

(21) Appl. No.: 13/298,566

(22) Filed: Nov. 17, 2011

(65) Prior Publication Data
US 2012/0160417 A1 Jun. 28, 2012

Related U.S. Application Data

(60) Provisional application No. 61/460,077, filed on Dec. 27, 2010.

(51) Int. Cl.
F16K 51/02 (2006.01)
F16K 41/10 (2006.01)
H01J 37/32 (2006.01)
H01L 21/67 (2006.01)
C23C 16/44 (2006.01)

(52) U.S. Cl.
CPC ............ *F16K 51/02* (2013.01); *C23C 16/4412* (2013.01); *F16K 41/10* (2013.01); *H01J 37/32807* (2013.01); *H01J 37/32834* (2013.01); *H01J 37/32908* (2013.01); *H01L 21/67017* (2013.01); *H01L 21/6719* (2013.01); *H01L 21/67126* (2013.01)

(58) Field of Classification Search
CPC .... F16K 51/02; F16K 41/10; H01J 37/32834; H01J 37/32807; H01J 37/32908; H01L 21/67126; H01L 21/67017; H01L 21/6719; C23C 16/4412
USPC .......................... 156/345.29, 354.26; 118/715
See application file for complete search history.

(56) References Cited

U.S. PATENT DOCUMENTS

| 4,721,282 | A | | 1/1988 | Shawver et al. |
| 5,116,023 | A | | 5/1992 | Contin |
| 5,150,734 | A | * | 9/1992 | Chiba ...................... 137/565.33 |
| 5,314,574 | A | * | 5/1994 | Takahashi ..................... 438/706 |
| 5,520,743 | A | * | 5/1996 | Takahashi ..................... 118/730 |
| 5,883,017 | A | * | 3/1999 | Tepman et al. ................ 438/800 |
| 6,427,969 | B1 | | 8/2002 | Ho et al. |
| 7,011,294 | B1 | | 3/2006 | Ehrne et al. |
| 7,500,649 | B2 | | 3/2009 | Litscher et al. |
| 7,637,477 | B2 | | 12/2009 | Hiroki |
| 7,731,151 | B2 | | 6/2010 | Lee |
| 8,051,870 | B2 | * | 11/2011 | Matsuura .................... 137/15.04 |
| 8,308,440 | B2 | * | 11/2012 | Shirai ............................ 417/28 |
| 2006/0162780 | A1 | * | 7/2006 | Matsuura ........................ 137/240 |
| 2009/0188624 | A1 | * | 7/2009 | Bera et al. ................. 156/345.29 |
| 2010/0282710 | A1 | * | 11/2010 | Kitamura et al. ............... 216/58 |
| 2011/0006236 | A1 | | 1/2011 | Williams et al. |
| 2012/0160417 | A1 | * | 6/2012 | Lee ........................... 156/345.33 |

* cited by examiner

Primary Examiner — Jeffrie R Lund
(74) Attorney, Agent, or Firm — Charles S. Guenzer

(57) ABSTRACT

A gate valve useful for pumping a high-vacuum processing chamber. The valve housing includes a first port for attachment to the vacuum chamber and a second port on the opposed wall and aligned with the first port for the external mounting of a pneumatic or other actuator having a shaft supporting on its end a valve gate plate within the housing. An expandable bellows sealed between the gate plate and the actuator surrounds shaft. The actuator can press the valve plate against a valve seat around the first port to close the valve or withdraw the plate to the opposed wall to provide high pumping conductance. A third port in the housing disposed from the valve is connected to the high-vacuum pump. The gate plate may be water cooled through channels in the shaft. An auxiliary vacuum pump, such as a cryo pump, may be placed inside the valve housing.

20 Claims, 4 Drawing Sheets

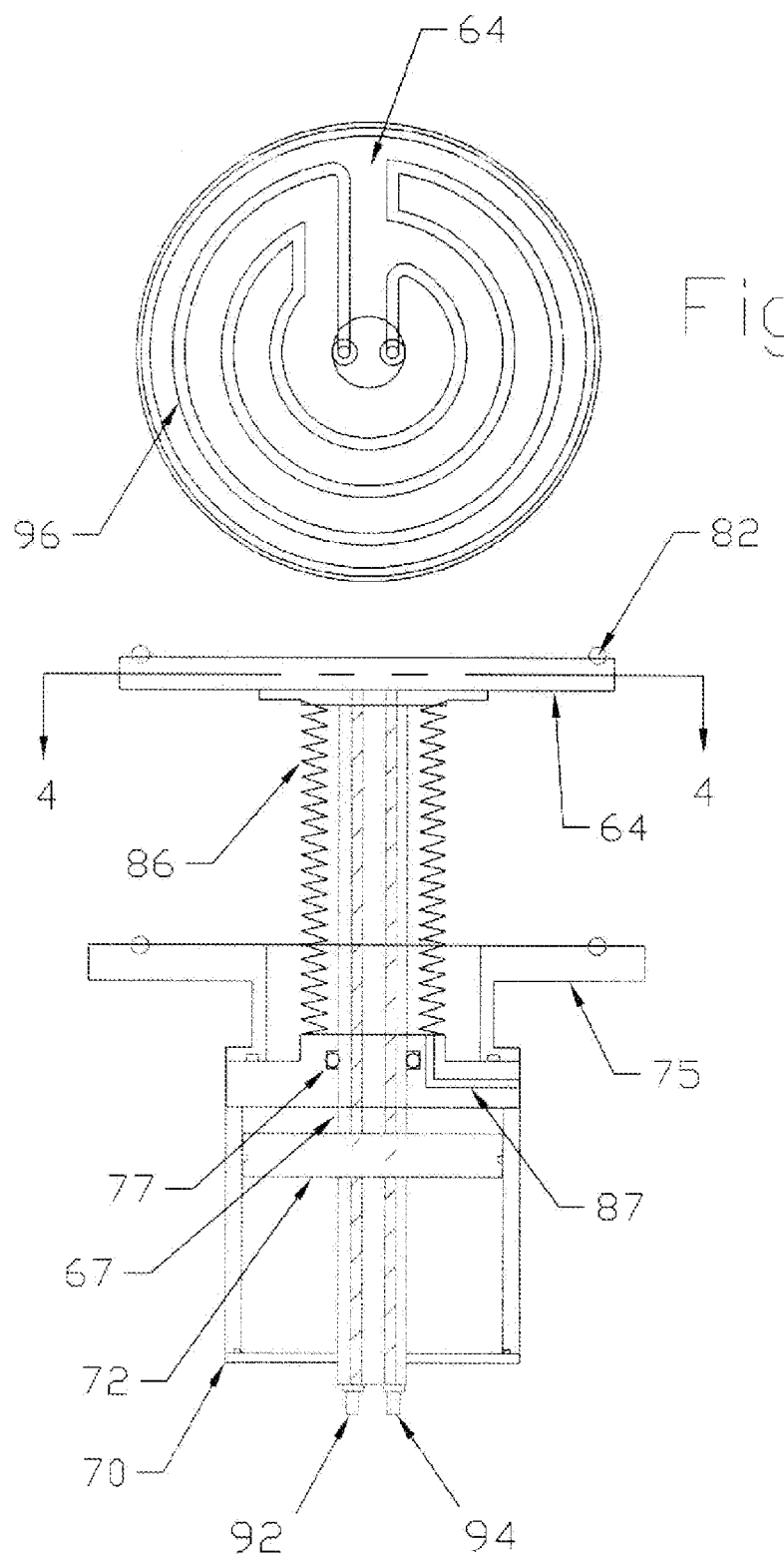

SINGLE AXIS GATE VALVE FOR VACUUM APPLICATIONS

RELATED APPLICATION

This application claims benefit of provisional application 61/460,077, filed Dec. 27, 2010.

FIELD OF THE INVENTION

The invention relates generally to valves. In particular, the invention relates to gate valves for high-vacuum pumping of processing chambers.

BACKGROUND ART

Similarly to many types of substrate processing, the formation of semiconductor integrated circuits often involves the processing of wafers or other substrates in a vacuum chamber. As schematically illustrated in the cross-sectional view of FIG. 1, an example processing system 10 includes a vacuum chamber 12 accommodating a pedestal 14 for supporting a substrate 16 inserted into the vacuum chamber 12 through a selectively opened valve or load/lock chamber 18. Processing gas is metered into the vacuum chamber 12 through a gas inlet 20, which may be in the form of a showerhead overlying the pedestal 14. A high-vacuum pump 22 connected to the vacuum chamber 12 through a pump port 24 pumps the vacuum chamber 12 and exhausts spent processing gas.

Such a processing system 10 may be used for etching, chemical vapor deposition (CVD), or sputtering (physical vapor deposition, PVD) depending on the choice of the processing gas and chamber configuration. For thermal processes, the pedestal 14 may be resistively heated to several hundred degrees centigrade to activate the chemical process. For plasma processes, the processing gas may be electrically excited into a plasma for activating the processes. Plasma processes generally involve lower temperatures but the plasma itself can generate heat. Plasma etching and plasma-enhanced CVD generally require that the chamber be background pumped of impurities to a high vacuum in the range of up to about $10^{-6}$ Torr. Such a processing system 10 may also be adapted to plasma sputtering in which an argon plasma sputters deposition material from a target placed in opposition to the pedestal 14. Plasma sputtering generally requires background pumping to an ultra-high vacuum of $10^{-9}$ Torr to prevent oxidation of the sputtered material. The vacuum pump 22 may be implemented as a turbo pump for a high vacuum. Although not illustrated, one or more mechanical low-vacuum pumps limited to about $10^{-3}$ Torr of pumped vacuum are usually used to pre-pump the vacuum chamber 12, to pump the load/lock chamber 18, and to back-pump the high-vacuum pump 22.

A gate valve 30 is interposed between the pump port 24 and the high-vacuum pump 22 to selectively isolate the vacuum chamber 12 from the high-vacuum pump 22. In the conventional design of FIG. 1, the high-vacuum pump 22 directly underlies the pump port 24 on the same vertical pumping axis. Corresponding apertures in opposed sides of a valve body 32 on the same pumping axis are vacuum sealed respectively to a flange 34 of the vacuum chamber 12 and to the high-vacuum pump 22 to allow direct vertical pumping of the vacuum chamber 12. A gate trolley 36 is rollably supported within the valve body 32 on bearings 38 to allow it to move horizontally, that is, perpendicularly to the pumping axis. An air cylinder 40 mechanically moves a shaft 42 which is fixed to a base plate 44 of the gate trolley 36 to move it along the horizontal axis. A gate plate 48 is mechanically coupled to the base plate 44 through toggle links 50 and is biased toward the base plate 44 by a tension spring 46.

A gate valve 30 is interposed between the pump port 24 and the high-vacuum pump 22 to selectively isolate the vacuum chamber 12 from the high-vacuum pump 22. In the conventional design of FIG. 1, the high-vacuum pump 22 directly underlies the pump port 24 on the same vertical pumping axis. Corresponding apertures in opposed sides of in a valve body 32 on the same pumping axis are vacuum sealed respectively to a flange 34 of the vacuum chamber 12 and to the high-vacuum pump 22 to allow direct vertical pumping of the vacuum chamber 12. A gate trolley 36 is rollably supported within the valve body 32 on bearings 38 to allow it to move horizontally, that is, perpendicularly to the pumping axis. An air cylinder 40 mechanically moves a shaft 42 which is fixed to a base plate 44 of the gate trolley 36 to move it along the horizontal axis. A gate plate 48 is mechanically coupled to the base plate 44 through toggle links 50 and is biased toward the base plate 44 by a tension spring 46.

A distal end 52 of the gate plate 48 extends beyond that of the base plate 44. However, when the air cylinder 40 pushes the base plate 44 of the gate trolley 36 to the closed position (illustrated on the right) adjacent the pump port 24, the distal end 52 encounters a stop in the valve body 32 and causes the gate plate 48 to rise and seal the pump port 24, thus closing the gate valve 30. When the air cylinder 40 retracts its shaft 42, the gate plate 48 moves away from the stop, the tension spring 36 lowers the gate plate 48, and the gate trolley 36 moves to the open position (illustrated on the left) away from the pump port 24.

This conventional design includes mechanical elements suffering from friction and wear. High impact force is required to convert the horizontal motion to vertical sealing, that is, two axis of motion, creating shock waves, vibration, and backlash. The guide bearings tend to fail from high stress and chemical deposits. Preventive maintenance is complex. In the case of a high-temperature environment, thermal expansion can cause binding and accelerated wear.

In U.S. Pat. No. 7,731,151, I have disclosed a pendulum valve with an expandable gate which can be used in the configuration of FIG. 1. However, this pendulum valve requires two actuators and includes many mechanical parts and seals.

SUMMARY OF THE INVENTION

One aspect of the invention is a vacuum gate valve having a gate plate supported on and fixed to an axially movable shaft and a sealing surface on a side of the gate plate opposite the shaft to engage and seal to a corresponding surface, for example, an O-ring in the gate plate engaging a valve seat in the valve housing.

Another aspect of the invention includes a vacuum substrate processing chamber having a valve body sealed to a chamber wall around a pumping aperture. An actuator protruding from a valve body wall opposite the pumping aperture projects into the valve body an axially movable shaft supporting a gate plate. The gate plate supported on the shaft is movable to seal the pumping aperture on its side opposite the shaft, thus closing the valve, or to withdraw the gate plate to near the valve body opposite the pumping aperture, thus opening the valve. An expandable bellows encloses the shaft inside the valve body and has ends vacuum sealed to the gate plate and the actuator or associated wall of the valve body. A vacuum pump, especially a high-vacuum pump such as a turbo pump, is sealed to another aperture in a wall of the valve body. A low-vacuum pump may be connectable through another port in the pump valve body.

The actuator may be pneumatic, motorized mechanical, such as a ball-screw drive, or manual.

An auxiliary pump, for example, a cryo pump or a getter pump, may be disposed inside the valve body.

BRIEF DESCRIPTION OF THE DRAWINGS

FIG. 3 is a side cross-sectional view of a valve actuator including coolant lines in the valve shaft supporting a substrate pedestal.

FIG. 4 is a top cross-sectional view of the pedestal of FIG. 3 taken along section line 4-4 and including a cooling channel.

DETAILED DESCRIPTION OF THE PREFERRED EMBODIMENTS

Figure 2:
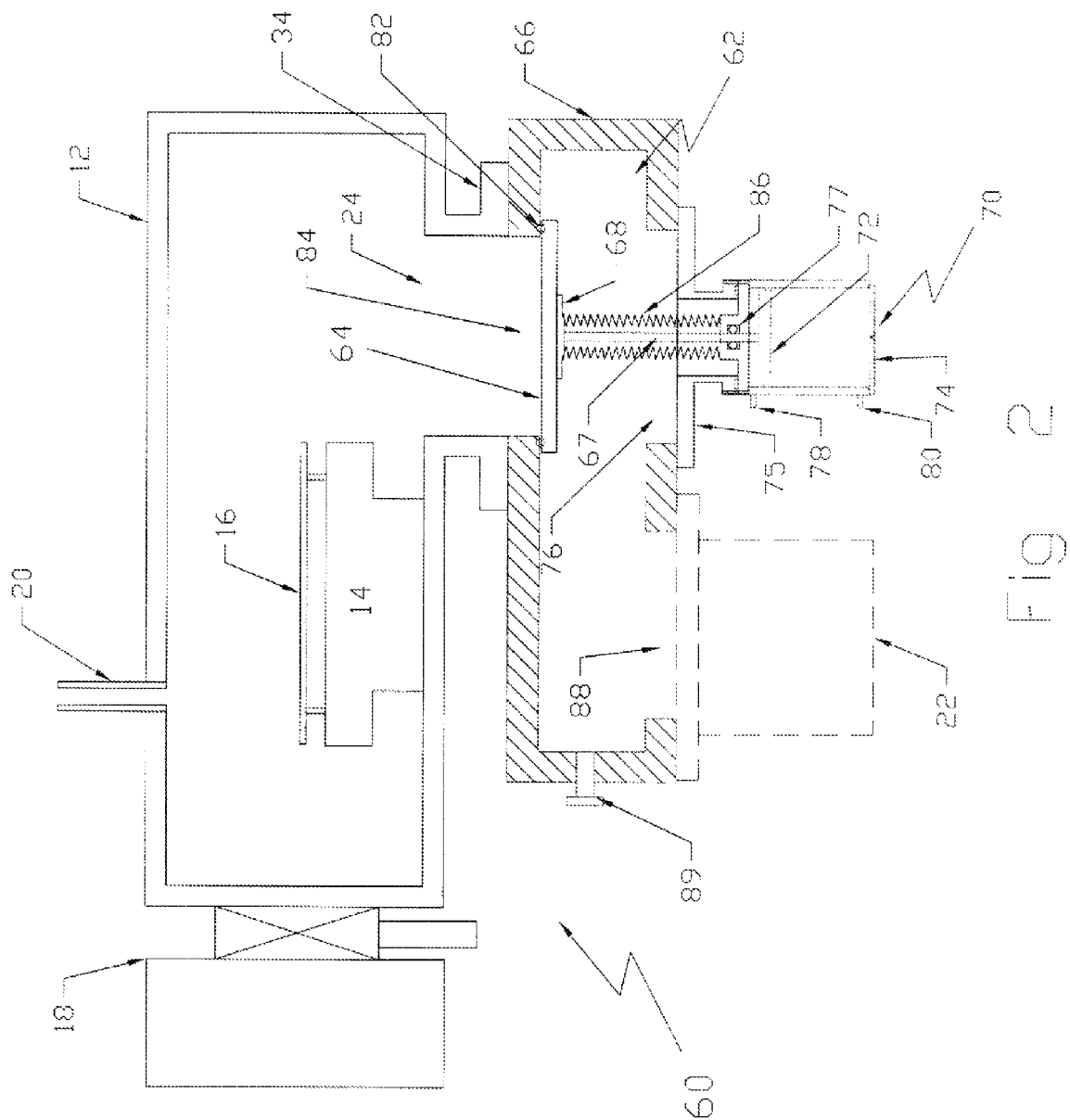
FIG. 2 is a schematic side cross-sectional view of a vacuum processing chamber and a vacuum gate valve according to one embodiment of the invention.

One embodiment of a processing system 60 of the invention, illustrated in the cross-sectional view of FIG. 2, includes a gate valve 62 having a gate plate 64 which is vertically moved within a valve housing 66 between the illustrated sealed position adjacent the pump port 24 and an open position closely adjacent the bottom of the valve body 66. The gate plate 64 is supported on the top of a shaft 67 fixed to the gate plate 64 through a detachable mount 68 The bottom of the shaft 67 is vertically moved by an actuator, such as a pneumatic cylinder 70, in which the shaft 67 is fixed to a piston 72 vertically movable in but pressure sealed to sides of a piston cylinder 74 of the air cylinder 70. The top of the air cylinder 70 is vacuum sealed through a removable collar 75 around an aperture 76 in the bottom wall of the valve body 66 underlying the pump port 24. Preferably, the shaft 67 penetrates the upper wall of the air cylinder 70 through a sliding seal, such as an O-ring 77, which only needs to stand off pneumatic and atmospheric pressures Gas inlets 78, 80 are positioned respectively above and below the range limits of the piston 72 and communicate with two air spaces separated by the piston 72. Pressure sources selectively connected to the gas inlets 78, 80 can pneumatically vertically move the shaft 67 and hence the gate plate 64 between the open and closed positions. In one type of pneumatic operation, positive pressure applied through the bottom inlet 80 and atmospheric pressure admitted to the upper inlet 78 will move the shaft 67 upward to seal the valve plate 64 to a valve seat in the upper wall of the valve body 66 and thus close the gate valve 62 while the opposite set of pressure conditions will move the shaft 67 downward to place the valve plate 64 near the bottom of the valve body 66 and thus open the gate valve 62 and leave a wide pumping cross section.

The pneumatic force is continued while the gate plate 64 is in the closed position so as to slightly compress a ring seal 82 between the gate plate 64 and a sealing surface or valve seat of the valve body 66 surrounding an aperture 84 in the upper wall of the valve body 66 juxtaposed to and aligned with the pump port 24. The ring seal 82, which may be elastomeric, e.g., an O-ring, or a soft metal ring, may be captured in an O-ring groove or similar structure in the periphery of the gate plate 64 or in the valve body 66. It is understood that the valve seat against which the ring seal 82 engages could be located on the flange 34 with a sufficiently large aperture 84 in the top wall to allow passage of the valve plate 64. In this case, the flange 34 can be considered part of the top wall of the valve body 66. Preferably, the gate plate 64 and upper wall aperture 84 are circular for ease of fabrication and ready alignment but other shapes are possible. The gate plate 64 preferably includes a planar annular periphery except for the O-ring groove but its central area may be non-planar as long as it provides a vacuum wall. The shaft 67 of the gate valve 62 acts as the stem and the gate plate 64 as the head of a modified poppet valve having its sealing surface on the opposite side of the head from the stem.

An expandable bellows 86 encloses the shaft 67 and its two ends are vacuum sealed to the mechanical mount 68 on the gate plate 64 and to the top wall of the air cylinder 70, for example, by welding, to isolate the shaft 67 and the piston cylinder 72 from the vacuum within the valve body 66. The pressure inside the bellows 86 may be atmospheric or even slightly pressurized. It is possible to mount the bellows 86 to the collar 75 or inside the valve body 66 with only the shaft 67 extending through the aperture 76 in the bottom wall of the valve body 66. An optional relief passage 87 (see FIG. 3) in the top wall of the air cylinder 70 connects the interior of the bellows 86 to atmosphere and the O-ring 77 slidably seals the shaft 67 to the top wall of the air cylinder 70.

The high-vacuum pump 22 is sealed around a pump aperture 88 in the valve body 66. In the illustrated embodiment, the pump aperture 88 is horizontally displaced from the pump port 24 and the gate valve 62, that is, from the opposed apertures 76, 84 in the valve body 66. Preferably, the cross section of the valve body 66 between the pump port 24 and the pump aperture 88 is at least as large as the cross section of the pump port 24 and its wall aperture 84 and of the pump aperture 88 in order to decrease the gas flow impedance degrading high-vacuum pumping. The reduced impedance also depends on the valve plate 64 being withdrawn close enough to the bottom of the valve body 66 that there is a similarly large horizontal cross section between the top of the withdrawn gate plate 64 and the top wall of the valve body 66. The movement of the gate valve 62 is completely vertical and involves no rubbing engagement in the valve body 66 aside from the O-ring seals, thereby reducing particulates. The valve body 66 can be rough pumped through a valved pumping port 89 prior to high-vacuum pumping by the high-vacuum pump 22.

Although FIG. 2 illustrates the high-vacuum pump 22 and its pump aperture 88 to be in the bottom wall of the valve body 66, they may be located in any of the five walls away from the gate valve 62. For example, in another embodiment, the pump aperture 88 is formed in a vertical wall of the valve body 66 adjacent the horizontal wall apertures 76, 84 but below the gate plate 64 in its closed position. However, the illustrated location of the high-vacuum pump 22 on the bottom wall projecting below the processing chamber 12 in otherwise unused space provides a reduced footprint.

The single-axis movement of the gate valve of the invention allows optional simple cooling of the valve plate 64 when it is exposed to high processing temperatures inside the vacuum processing chamber 12. As illustrated in the cross-sectional side view of FIG. 3, the shaft 67 supporting the gate plate 64 optionally includes two axially extending coolant channels 92, 94 which have upper ends connected to respective ends of a convolute cooling channel 96 formed in the gate plate 64, as shown in the cross-sectional top view of FIG. 4 taken along section line 4-4 of FIG. 3. A circular plate may be welded to the top of the gate plate 64 to enclose the cooling channel 96. The shaft 67 is fixed and sealed to the piston 72 but extends through it and its lower end extends out the bottom of the air cylinder 70. The two coolant channels 92, 94 are thus exposed to ambient and may be connected to the supply and drain of a cooling system, such as a liquid refrigeration unit to supply chilled liquid coolant, such as water, to cool the gate plate 64 and its O-ring 82.

Figure 5:
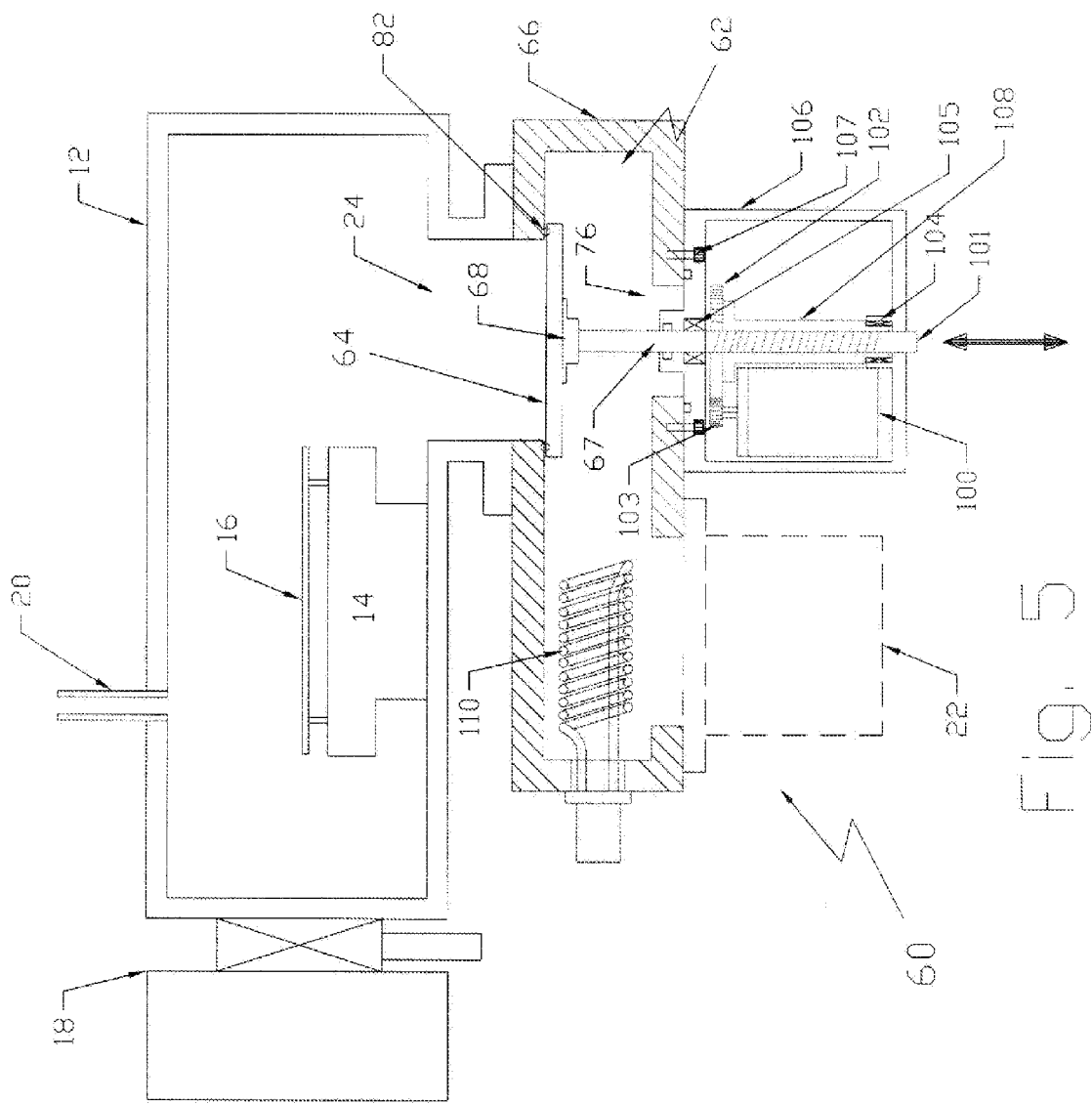
FIG. 5 is a side cross-sectional view of a vacuum processing chamber and a gate valve of the invention including two features of a mechanical drive and an auxiliary vacuum pump.

Other types of actuators may be used in place of the air cylinder. For example, the shaft 67 may be coupled to a mechanical drive driven by a reversible electric motor. In a motorized mechanical embodiment illustrated in the cross-sectional view of FIG. 5, a motor 100 rotates a gear 103 which is engaged to a gear 103 on top of an elongated nut 108 rotatably supported on bearings 104 and inside of which is threaded the shaft 67. Bearings 105 allow the shaft 67 to move vertically but not to rotate so that the shaft 67 forms a ball screw. As a result, as the motor 100 rotates the nut, the shaft 67 moves up or down between the open and closed positions of the gate valve. The figure also shows a drive casing 106 attached by screws 107 to the bottom wall of valve body 66. Alternatively, the shaft 67 may be threaded and rotated through a nut fixed to the valve body. For some applications, manual rotation of the worm drive or threaded shaft may be sufficient. For manual actuation, the actuator can be considered to be the handle turning the shaft. Mechanical actuation, for example, through a motor allows the gate plate 64 to assume multiple positions away from the pumping port 24 and the sealing surface and thus to variably throttle the high-vacuum pumping. This figure does not illustrate the bellows 86 surrounding the shaft 67, which operates similarly to that illustrated in FIGS. 2 and 4.

In another aspect of the invention, the valve body may accommodate other equipment. For example, as additionally illustrated in FIG. 5, an auxiliary pump 110 may be placed in the valve body 66. As an example, a turbo pump is effective for use as the main high-vacuum pump 22 but is not efficient at pumping some gases such as water vapor and non-inert gas. In such a situation, the auxiliary pump 110 may be a cryo pump, a getter pump, or other type of pump operating together with the main high-vacuum pump 22. In other types of applications, a getter pump can be added for hydrogen pumping or analysis instruments such as a low-pressure or high-pressure vacuum gauge may be added to measure performance of base pressure or to diagnose the integrity of the roughing pump before its failure to thereby protect system performance. One possible diagnostic instrument is a residual gas analyzer (RGA), which measures over time the composition of a gas mixture and partial pressures of the gases in the mixture, thereby capable of determining the gas resulting from contamination or a leak.

The metal bellows allows a valve mechanism in which no mechanically moving parts are exposed to a vacuum or to possibly deleterious processing gases. Although the bellows provides a simple and dependable vacuum seal for the moving shaft, it is understood that sliding vacuum seals or other means may be substituted.

Figure 1:
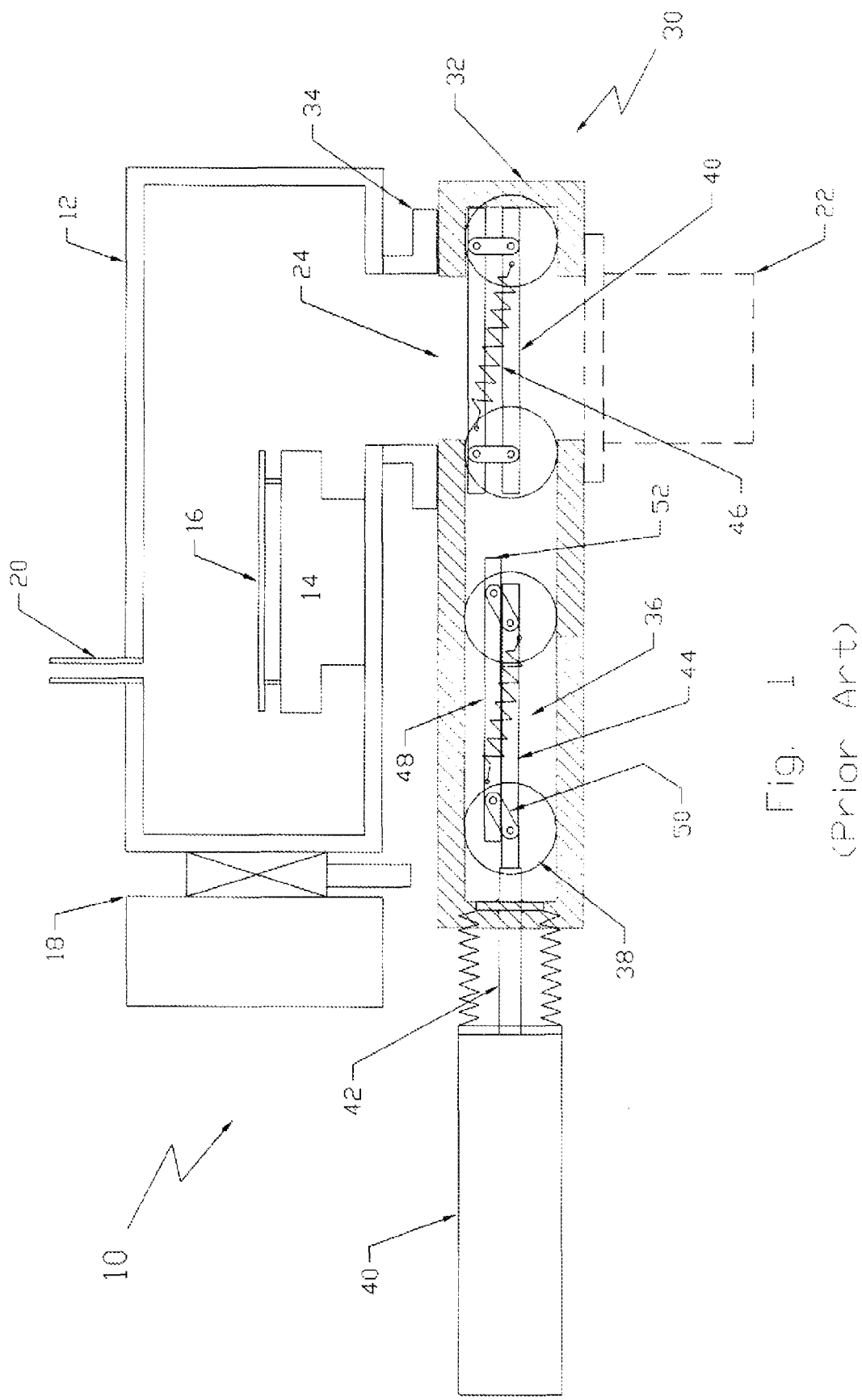
FIG. 1 is a schematic cross-sectional view of a vacuum processing chamber and a conventional vacuum gate valve.

The invention provides a number of advantages. The turbo pump is located away from the pump port of the processing chamber and is thus somewhat protected from debris falling out of the processing chamber. The large cross section of the valve body does not significantly reduce the pumping conductance. The valve mechanism is relatively compact and does not require a large footprint. In the illustrated embodiment, it can be fit under the processing chamber. The valve mechanism utilizes low force and thus experiences reduced stress, wear, and vibration. Unlike the conventional valve of FIG. 1, there is no back lash. The mechanism is highly reliable and has demonstrated a lifetime of 1.5 million cycles. If the actuator is electrically powered, the valve can act as a throttling valve and as a slow pumping valve. Most of its parts are not exposed to wear or vacuum and thus can be fabricated from aluminum or stainless steel. The valve works in any orientation. For example, the pump port may be placed on the side wall or top wall of the processing chamber.

What is claimed is:

1. A gate valve for attachment between a vacuum pump and a processing chamber for accommodating within an interior thereof a substrate during processing thereof, comprising:
    a valve body having vacuum walls enclosing an interior space and including a first wall and an opposed second wall;
    a first aperture in the first wall and arranged about a first axis for juxtaposition and detachable mounting to a pump port of the processing chamber extending from the interior of the processing chamber along the first axis to provide communication between the vacuum pump and the processing chamber while the processing chamber is configured for processing of the substrate, the first wall having a valve seat surrounding the first aperture on a side of the first wall;
    a second aperture in the second wall arranged about the first axis;
    an actuator disposed outside of the valve body;
    a shaft movable along the first axis by the actuator, extending through the second aperture, and vacuum sealed from the interior of the valve body,
    a gate plate supported on the shaft;
    a seal compressible between the gate plate and the valve seat; and
    a third aperture in one of the vacuum walls and separated from the first and second apertures and configured for mounting to an inlet of the vacuum pump.

2. The valve of claim 1, wherein the gate plate is fixed to the shaft.

3. The valve of claim 2, wherein the actuator is pneumatically powered.

4. The valve of claim 2, wherein the actuator is electrically powered and the gate plate is movable to a plurality of positions away from the seal.

5. The valve of claim 1, further comprising an expandable bellows enclosing the shaft at least inside the valve body, extending through the second aperture, and vacuum sealed to the gate plate inside the interior space and to the actuator at a location exterior of the second wall.

6. The valve of claim 1, wherein the seal comprises an elastomeric O-ring disposed in a peripheral groove in the gate plate.

7. The valve of claim 1, further comprising:
    a cooling channel formed in the gate plate; and
    two coolant channels axially extending along the shaft, connected on first ends thereof to opposed ends of the cooling channel and connectable on second ends thereof to a source of cooling liquid.

8. The valve of claim 7, wherein the cooling channel has an open convolute shape within the gate plate and is covered by a plate.

9. The gate valve of claim 1, wherein the third aperture is formed in a bottom one of the vacuum walls.

10. A vacuum processing chamber, comprising:
    a vacuum chamber including a support mounted on a fixed wall of the vacuum chamber for supporting a substrate for processing;

a pump aperture formed in a chamber wall of the vacuum chamber and arranged about a first axis, which chamber wall extends transversely to the first axis;

a valve body comprising vacuum walls enclosing an interior space and including (1) a first wall having a first aperture arranged about the first axis and detachably juxtaposed and vacuum sealed to the chamber wall and (2) a second wall opposed to the first wall and including a second aperture formed therein and arranged about the first axis;

an actuator fixed to the second wall and disposed at least partially outside of the valve body;

a shaft coupled to the actuator for movement along the first axis;

a movable gate plate supported on a first side thereof on the shaft and sealably engageable on a second side thereof with a sealing surface associated with the first aperture;

a vacuum pump having an inlet sealed to a third aperture in one of the vacuum walls and displaced from the first and second apertures to pump the vacuum chamber while the substrate is being processed therein.

11. The processing chamber of claim 10, wherein the valve body is mounted underneath the vacuum chamber and the vacuum pump is mounted underneath the valve body.

12. The processing chamber of claim 10, wherein the actuator includes an electric motor and wherein the gate plate is stoppable at more than one position away from the sealing surface.

13. The processing chamber of claim 10, wherein a convolute cooling channel is formed in the gate plate and two coolant channels are formed in the shaft, connected to two respective ends of the cooling channel, and connectable to a source of a cooling liquid.

14. The processing chamber of claim 10, further comprising an auxiliary pump disposed within the interior space for additionally pumping the vacuum chamber.

15. The processing chamber of claim 10, wherein a cross-sectional area of the valve body between the first aperture and the third aperture is at least as great as the areas of each of the first and third apertures.

16. The processing chamber of claim 10, further comprising a gas analyzer disposed within the interior space.

17. The processing chamber of claim 10, further comprising an expandable bellows enclosing the shaft at least inside the valve body, extending through the second aperture, and vacuum sealed to the gate plate inside the interior space and to the actuator at a location exterior of the second wall.

18. A gate valve for attachment between a vacuum pump and a processing chamber, comprising:

a valve body detachably mountable to a chamber wall of the processing chamber and having vacuum walls on sides of an interior space, which vacuum walls include a first wall vacuum sealable to the processing chamber around a pump port arranged about a first axis in the chamber wall;

a first aperture in the first wall and arranged about the first axis for juxtaposition to the pump port of the processing chamber, the first wall having a valve seat surrounding the first aperture;

an actuator including a shaft movable along the first axis within the interior space;

a gate plate supported on the shaft and vacuum sealable with the valve seat; and a second aperture in one of the vacuum walls and displaced away from the first axis for mounting to a vacuum pump.

19. The gate valve of claim 18, wherein the actuator is mounted on a third wall opposite the first wall and outside of the interior space.

20. The gate valve of claim 18, wherein the second aperture is disposed in a bottom one of the vacuum walls.

* * * * *